US011100982B2

(12) United States Patent
Meredith et al.

(10) Patent No.: US 11,100,982 B2
(45) Date of Patent: *Aug. 24, 2021

(54) MEMRISTIVE DEVICE AND METHOD BASED ON ION MIGRATION OVER ONE OR MORE NANOWIRES

(71) Applicant: AT&T Intellectual Property I, L.P., Atlanta, GA (US)

(72) Inventors: Sheldon Kent Meredith, Roswell, GA (US); Yevgeniy Puzyrev, Cumming, GA (US); William C. Cottrill, Canton, GA (US)

(73) Assignee: AT&T Intellectual Property I, L.P., Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/922,786

(22) Filed: Jul. 7, 2020

(65) Prior Publication Data

US 2020/0335161 A1 Oct. 22, 2020

Related U.S. Application Data

(63) Continuation of application No. 16/159,075, filed on Oct. 12, 2018, now Pat. No. 10,748,608.

(51) Int. Cl.
*G11C 13/00* (2006.01)
*H01L 45/00* (2006.01)
*B82Y 10/00* (2011.01)

(52) U.S. Cl.
CPC ........ *G11C 13/0007* (2013.01); *G11C 13/004* (2013.01); *G11C 13/0069* (2013.01);
(Continued)

(58) Field of Classification Search
None
See application file for complete search history.

(56) References Cited

U.S. PATENT DOCUMENTS

| 8,008,648 B2 | 8/2011 | Bratkovski et al. |
| 8,050,078 B2 | 11/2011 | Bratkovski et al. |

(Continued)

FOREIGN PATENT DOCUMENTS

| CN | 106992249 A | 7/2017 |
| DE | 102012209336 A1 | 12/2013 |
| WO | 2012118481 A1 | 9/2012 |

OTHER PUBLICATIONS

Chua, Leon O., "Memristor—The Missing Circuit Element", IEEE Transactions on Circuit Theory, vol. Ct-18, No. 5, Sep. 1971, 13 pages.

(Continued)

*Primary Examiner* — J. H. Hur
(74) *Attorney, Agent, or Firm* — Guntin & Gust, PLC; Matthew Tropper

(57) ABSTRACT

Aspects of the subject disclosure may include, for example, applying a setting voltage across first and second electrodes, wherein a nanowire with a first electrical resistance is electrically connected between the first and second electrodes, wherein the applying of the setting voltage causes a migration of ions from the first and/or second electrodes to a surface of the nanowire, and wherein the migration of ions effectuates a reduction of electrical resistance of the nanowire from the first electrical resistance to a second electrical resistance that is lower than the first electrical resistance; and applying a reading voltage across the pair of electrodes, wherein the reading voltage is less than the setting voltage, and wherein the reading voltage is sufficiently small such that the applying of the reading voltage causes no more than an insignificant change of the electrical resistance of the nanowire from the second electrical resistance. Other embodiments are disclosed.

20 Claims, 10 Drawing Sheets

(52) U.S. Cl.
CPC .......... *G11C 13/0097* (2013.01); *H01L 45/08* (2013.01); *H01L 45/1266* (2013.01); *H01L 45/146* (2013.01); *B82Y 10/00* (2013.01)

(56) References Cited

U.S. PATENT DOCUMENTS

| | | | |
|---|---|---|---|
| 8,093,575 B2 | 1/2012 | Xia et al. | |
| 8,207,593 B2 | 6/2012 | Bratkovski et al. | |
| 8,332,340 B2 | 12/2012 | Snider | |
| 8,450,711 B2 | 5/2013 | Williams et al. | |
| 8,501,621 B2 | 8/2013 | Kochergin | |
| 8,710,483 B2 | 4/2014 | Yang et al. | |
| 8,716,688 B2 | 5/2014 | Strachan et al. | |
| 8,891,283 B2 | 11/2014 | Strukov | |
| 9,082,533 B2 | 7/2015 | Yang et al. | |
| 9,171,613 B2 | 10/2015 | Bratkovski et al. | |
| 9,508,928 B2 | 11/2016 | Wang et al. | |
| 9,978,940 B2 | 5/2018 | Bessonov et al. | |
| 9,997,703 B2 | 6/2018 | Lam et al. | |
| 10,748,608 B2 * | 8/2020 | Meredith | H01L 27/2472 |
| 2008/0224123 A1 * | 9/2008 | Martin | B82Y 30/00 257/23 |
| 2008/0280069 A1 * | 11/2008 | Parce | B82B 3/00 427/580 |
| 2010/0102290 A1 * | 4/2010 | Lu | H01L 27/2409 257/4 |
| 2012/0001143 A1 | 1/2012 | Strukov et al. | |
| 2012/0012809 A1 | 1/2012 | Yang et al. | |
| 2012/0135158 A1 * | 5/2012 | Freer | H01L 21/02603 427/532 |
| 2012/0241706 A1 | 9/2012 | Lee et al. | |
| 2015/0090953 A1 | 4/2015 | Boland et al. | |
| 2015/0236257 A1 | 8/2015 | Walls et al. | |
| 2017/0213959 A1 | 7/2017 | Gibson et al. | |
| 2017/0249990 A1 | 8/2017 | Bauer et al. | |
| 2020/0118623 A1 | 4/2020 | Meredith et al. | |

OTHER PUBLICATIONS

He, Xiongwu, "Memristive properties of hexagonal WO 3 nanowires induced by oxygen vacancy migration", Nanoscale research letters 8.1 (2013), 8 pages.

Liu, S. Q. et al., "Electric-pulse-induced reversible resistance change effect in magnetoresistive films", Appl. Phys. Lett.76, 2749 (2000), 2000, Abstract, 5 pages.

Prakash, Amit et al., "Resistive switching memory characteristics of Ge/GeO x nanowires and evidence of oxygen ion migration", Nanoscale research letters 8.1 (2013), 10 pages.

Puzyrev, et al., "Memristive devices froom ZnO naanowire bundles and meshes", Applied Physics Letters 111, AIP Publishing, 2017, 4 pages.

Strukov, Dmitri B. et al., "Four-demensional address topology for circuits with stacked multilayer crossbar arrays", PNAS Early Edition, www.pnas.org/cgi/doi/10.1073/pnas.0906949106, Jun. 22, 2009, 4 pages.

Strukov, Dmitri B. et al., "The missing memristor found", Nature, vol. 453, May 1, 2008.

Tsuruoka, Tohru et al., "Forming and switching mechanisms of a cationmigration-based oxide resistive memory", Nanotechnology 21.42 (2010), 9 pages.

Waser, , "Nanoionics-based resistive switching memories", Nature Materials, vol. 6, Nov. 2007, Nov. 2007, 8 pages.

Yang, et al., "Nonvolatile resistive switching in single crystalliine ZnO nanowires", Nanoscale, 2011, The Royal Society of Chemistry, 2011, 3 pages.

Yang, Joshua et al., "The mechanism of electroforming of metal oxide memristive switches", Nanotechnology 20 (2009), 10 pages.

You, Byoung Kuk et al., "Reliable memristive switching memory devices enabled by densely packed silver nanocone arrays as electric-field concentrators", ACS nano 10.10 (2016), 11 pages.

Puzyrev, et al., "Supplemental Information—Memristive devices from ZnO nanowire bundles and meshes", Applied Physics Letters 111, AIP Publishing, 2017 (published online Oct. 13, 2017), 5 pages.

* cited by examiner

100A

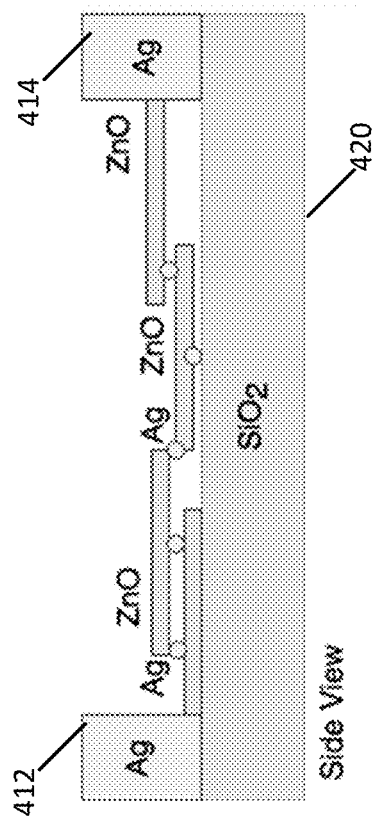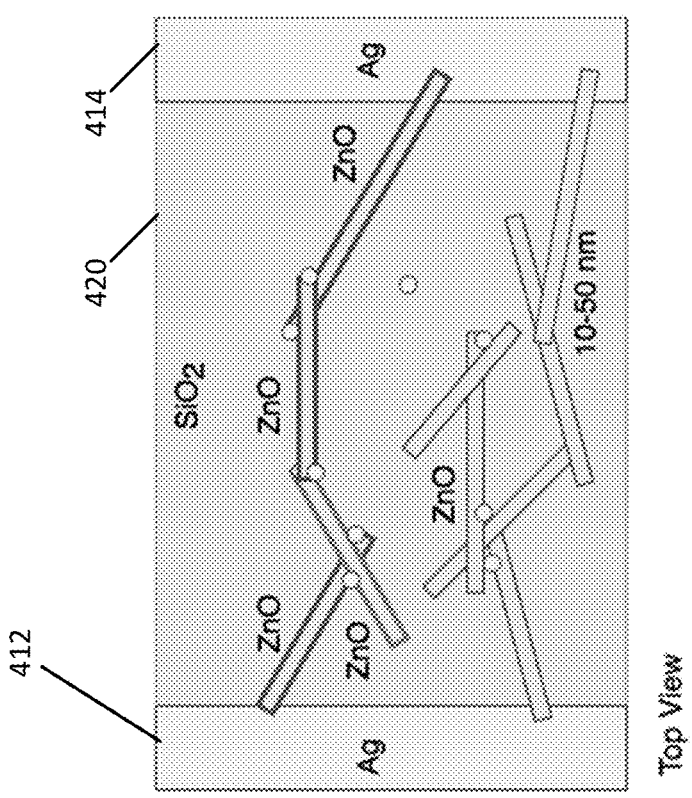
FIG. 4B
FIG. 4A

600

Applying, by a processing system including a processor, a first setting voltage across a pair of electrodes, wherein the pair of electrodes comprises a first electrode and a second electrode, wherein a first nanowire with a first electrical resistance is electrically connected between the first electrode and the second electrode, wherein the applying of the first setting voltage causes a migration of ions from one or more of the first electrode and the second electrode to a surface of the first nanowire, and wherein the migration of ions effectuates a reduction of electrical resistance of the first nanowire from a first electrical resistance to a second electrical resistance that is lower than the first electrical resistance ⸺ 802

Applying, by the processing system, a first reading voltage across the pair of electrodes, wherein the first reading voltage is less than the first setting voltage, and wherein the first reading voltage is sufficiently small such that the applying of the first reading voltage causes no more than an insignificant change of the electrical resistance of the first nanowire from the second electrical resistance ⸺ 804

MEMRISTIVE DEVICE AND METHOD BASED ON ION MIGRATION OVER ONE OR MORE NANOWIRES

CROSS-REFERENCE TO RELATED APPLICATION(S)

This application is a continuation of U.S. patent application Ser. No. 16/159,075, filed on Oct. 12, 2018. All sections of the aforementioned application(s) and/or patent(s) are incorporated herein by reference in their entirety.

FIELD OF THE DISCLOSURE

The subject disclosure relates to a memristive device and method based on ion migration over one or more nanowires (e.g., metal-oxide nanowires).

BACKGROUND

The word memristor is a portmanteau of memory and resistor where the state of the device has a memory property, achieved by a historical voltage/current applied to the device. This type of device was theorized in 1971 by L. Chua. Around 2008, Hewlett Packard used oxygen ion migration through the bulk crystalline structure of titanium dioxide, bounded by platinum electrodes. Various attempts at a memristor implementation have had the challenge of requiring very high fields to force ion migration through the bulk, leading to formation of conductive internal paths, which suffers from instabilities in, for instance, the TiO2 crystal structure.

BRIEF DESCRIPTION OF THE DRAWINGS

Reference will now be made to the accompanying drawings, which are not necessarily drawn to scale, and wherein:

FIG. 1A shows an Ag ion on a ZnO surface and FIG. 1B shows an Ag ion between two ZnO surfaces, forming a nanowire trench. The electronegativity potential between the Ag ion and the surface/s is different, causing the Ag ions to rest in a nanowire trench between semiconductor surfaces of overlapping nanowires.

FIGS. 4A and 4B show a schematic representation of materials and conduction mechanism for a ZnO nanowire mesh according to an embodiment. In these FIGS., the nanowire mesh is represented by the elongated ZnO bars (the nanowire mesh is on a SiO2 substrate). FIG. 4A shows a top view of the device and FIG. 4B shows a side view of the device.

FIG. 7A is a top view. Two groups of nanowires are shown in FIG. 7A as two islands (701 and 703) for demonstration purposes. FIG. 7B is a side view. One nanowire mesh is shown in FIG. 7B for demonstration purposes as spanning and connecting three top contacts and three bottom contacts.

FIG. 8 depicts an illustrative embodiment of a method in accordance with various aspects described herein.

DETAILED DESCRIPTION

The subject disclosure describes, among other things, illustrative embodiments for a memristive device and method based on ion migration over nanowires (e.g., metal-oxide nanowires). Other embodiments are described in the subject disclosure.

One or more aspects of the subject disclosure include a memristive device comprising a metal-oxide semiconductor base material bounded between two electrical contacts, generally on opposite sides of the device. This fundamental electronic device can be used for non-volatile information storage with zero maintenance energy and/or as a neuromorphic multi-level processor suitable for deep learning computing. The construction of the device, in various embodiments, is two-dimensional as would be typical of solid state epitaxial deposition manufacturing methods. The electrical contacts may use the same metal, but there are specific benefits (described in more detail below) to using different metals for each. The device can be constructed at a nanometer scale consistent with state-of-the-art methods for solid state fabrication for metals, semiconductors and metal-oxides. Being, in various embodiments, a two-terminal fundamental device, such a memristor reduces non-volatile memory production costs, thereby allowing greater memory holding capacity, as well as on-memory calculation (especially in mobile and internet-of-things (IoT) devices).

In various embodiments, the memristor design uses any of several possible metal-oxide substrates having low electrical conductivity, even at the military temperature range (e.g., −55 to 125° F.). Examples include titanium dioxide as a substrate and carbon nanotubes with appropriate chirality as a nanowire. The design allows for different electrode materials, but is typically expected to be lithium, copper, titanium, silver, gold, or any of the platinum group metals. For various discussions below, silver (Ag) will be used as the example electrode material and zinc oxide (ZnO) as the example base material.

Figure 1A:
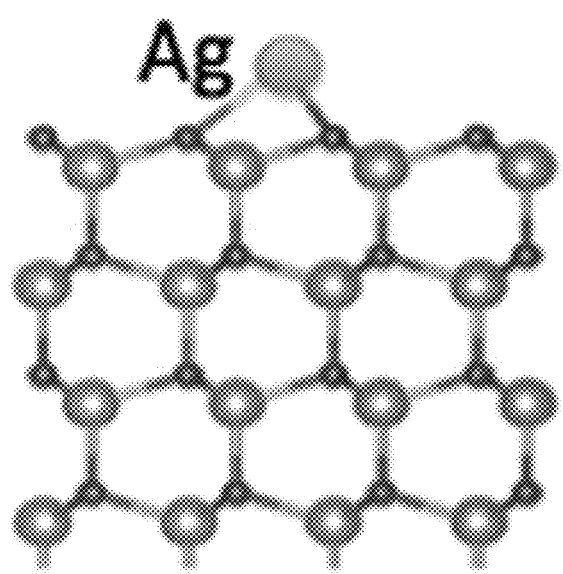
FIGS. 1A and 1B show two atomic structure configurations (100A and 100B, respectively) for an Ag ion according to various embodiments.
Figure 1B:
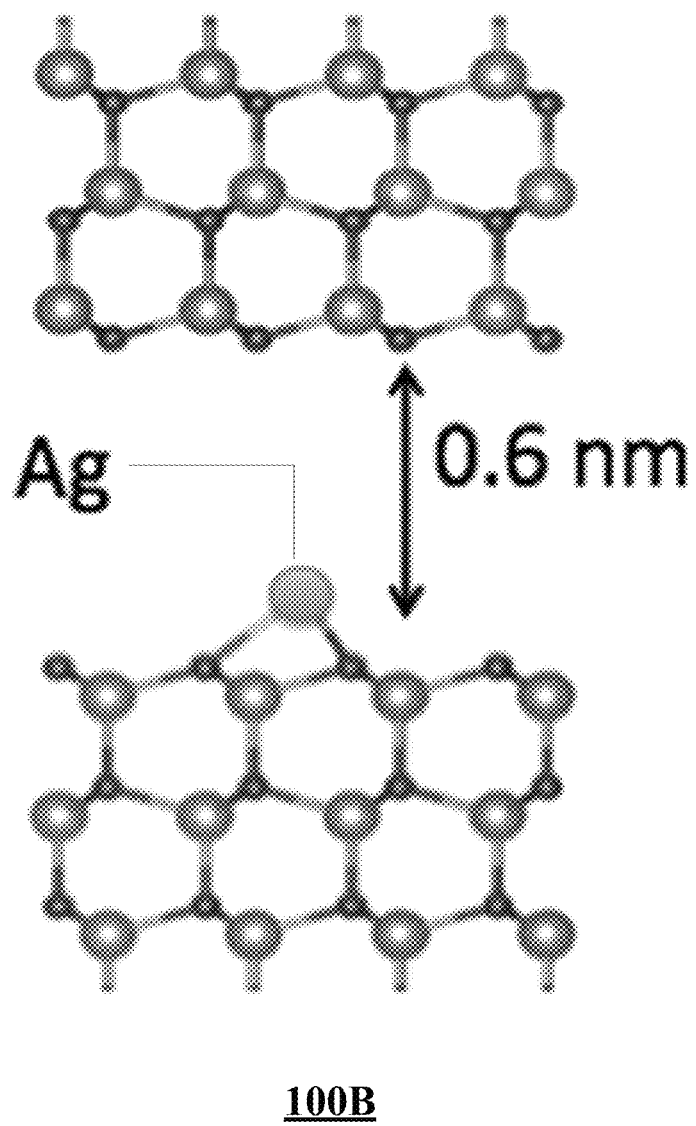

Referring now to FIGS. 1A and 1B, these FIGS. show the supporting physical mechanism of Ag binding between the surfaces. Ab-initio (quantum chemistry) calculations of electronic structure and energy differences result in ~0.5 eV as the energy required to move each Ag ions from the region between two ZnO surfaces (forming the gap) to the free ZnO surface outside the gap. The energy difference for two atomic structure configurations shown in FIGS. 1A and 1B represents the Ag binding between the ZnO surfaces. This leads to formation of a potential well between two nanowires (shown, for example, in FIG. 2), where Ag ions can localize. Existence of such a potential leads to increased concentration of Ag on ZnO in the potential well, where Ag can donate an electron and form the conductive channel for a nanowire device.

Figure 2:
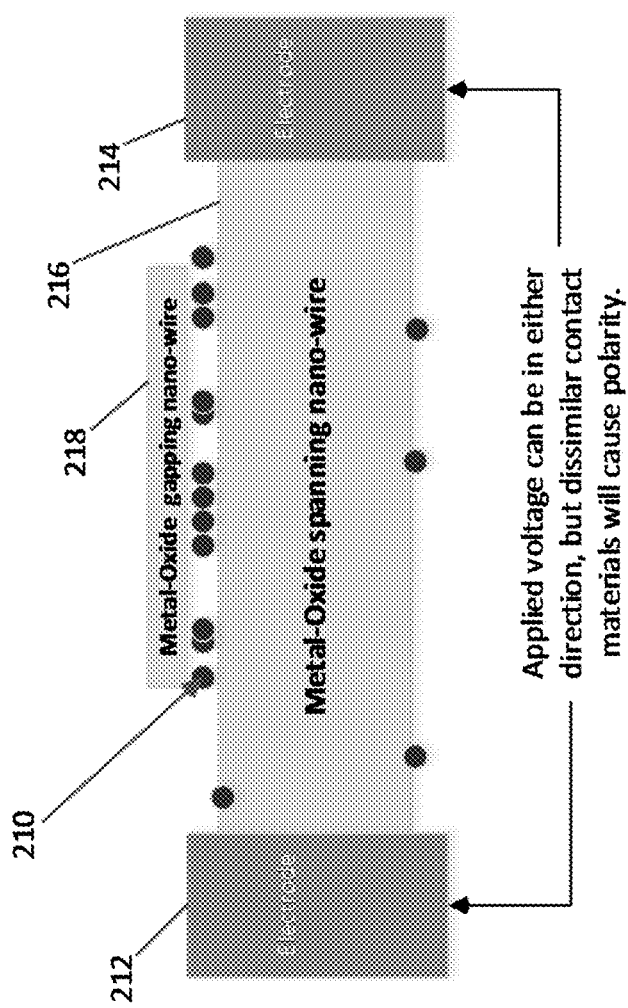
FIG. 2 shows a memristive device 200 according to an embodiment. The device of this FIG. 2 has a metal-oxide substrate (not shown). Metallic electrodes are located on top of the metal-oxide substrate. In addition, two parallel nanowires (with a controlled gap) are located on top of the metal-oxide substrate. Ag ions prefer to rest in the potential well in the nanowire gap (between the two parallel nanowires), greatly increasing conductivity of the device. Applied voltage can be in either direction, but dissimilar contact materials (electrodes) will cause polarity.

Referring now to FIG. 2, the memristive device 200 of this embodiment comprises a metal-oxide spanning nanowire 216, bounded by metallic contacts 212, 214 at either end. Further, a metal-oxide gapping nanowire 218 (discussed in more detail below) is disposed substantially parallel to the metal-oxide spanning nanowire 216. The device 200 has an original state of being without the Ag ions disposed on the surface of metal-oxide spanning nanowire 216. The length of the metal-oxide spanning nanowire 216 is typically expected to be between 10 and 100 nm. When a sufficiently large voltage (e.g., on the order of 1V) is applied between electrodes 212 and 214, Ag ions can jump over the potential barrier, due to electronegativity differences between the materials at the contact junction. This voltage applied over such a short distance between electrodes 212 and 214 implies a high E-field (E=V/d), capable of electro-forming and drawing Ag ions from the metal contact and onto the outside of the metal-oxide spanning nanowire 216, eventually over its full length. This does not result in complete coating or electroplating of the surface of the metal-oxide spanning nanowire 216; only a few-atom clusters accumulate on the surface. Unlike electrons which move readily and quickly, the migration of Ag ions takes more time and more ions are drawn from the electrode to the base material with time. Once these Ag ions migrate onto the surface of the metal-oxide spanning nanowire 216, they are highly mobile (such migration has generally been a historical source of problems for electronic circuits, since metal ions have long been known to migrate over semiconductors or dielectrics and sometimes short circuit components or wires). This step is analogous to electro-forming in a traditional memristive mechanism, with an important distinction of ion migration along the surface, instead of the bulk. Memristors of various embodiments described herein rely on this Ag migration effect to modify the metal-oxide spanning nanowire resistance between electrodes 212 and 214 by essentially peppering the metal-oxide material of the metal-oxide spanning nanowire 216 with Ag ions. The Ag ions populate the surface of the metal-oxide spanning nanowire 216, get trapped in the nanogap and raises the conductivity of the nanowire 216 spanning between the contacts. This does not require penetration of the Ag ions into the bulk of the material of nanowire 216. To force the Ag ions to settle at prescribed distances from the electrodes, another semiconductor nanowire 218 is used, which is configured geometrically parallel to the spanning nanowire 216 and forms a gap where Ag ions experience a simultaneous interaction with both wires (that is metal-oxide spanning nanowire 216 and metal-oxide gapping nanowire 218).

Still referring to FIG. 2, this shows one design example, where Ag ions settling in gap 210 effectively provides conductive doping of the spanning nanowire 216 without migrating uniformly over its entire length. Applying a "SET" voltage (discussed in more detail below) causes the initial Ag ion migration, thereby dramatically increasing the conductivity of the spanning nanowire channel, after which the device is declared to be in a "high" conductivity state. Until the Ag ions are removed, the device will remain indefinitely in this "high" state. No other energy need be applied. To deplete the Ag ions from the outside of the spanning nanowire, a "RESET" voltage is applied that is lower in magnitude than the SET voltage (because it requires less energy to push the Ag ions back over the potential barrier and back to an electrode than the other way around). One may think of this as having enough voltage to pull the ions out of the spanning nanowire channel, but not enough to pull more ions onto the metal-oxide base material from the metallic end contact. For instance, depending on the choice of nanowire material, electrode materials and the gapping nanowire, the RESET voltage can be significantly below the SET voltage. The SET and RESET voltages can be thought of as "WRITE" commands to compel the storage of a "0" or a "1" as effected (for example) by a non-conducting or conducting state respectively. Modification of the length, position, and gap of the gapping nanowire allows for modification of the RESET voltage, because such gapping characteristics modify the potential energy required to move Ag ions out of the gap. Note that the low-conductivity state differs from the original state since concentration of Ag ions remains significant. Regardless of the state of the memristor, a "READ" operation on the memory state requires only a very small voltage to test the resistance of the device. Testing the resistance may be done, for example, using a circuit such as an open collector which floats in a high voltage state unless pulled to ground via a high conductivity path, such as through the memristor in a "high" state. The memristor according to various embodiments does not lose Ag ions during the READ function, because the very small applied voltage is insufficient to move the Ag ions out of the gap, so they remain there indefinitely unless a RESET voltage is applied.

Still referring to FIG. 2, it is seen that ions will tend to settle in the potential well 210 between the Metal-Oxide gapping nanowire 218 and the Metal-Oxide nanowire 216. Depth of this energy gap depends upon materials and gap width.

Still referring to FIG. 2, in various examples the Metal-Oxide gapping nanowire 218 can comprise ZnO, TiO2, carbon nanotube and/or VO2 and the length can be ~10-100 nm.

Still referring to FIG. 2, in various examples the Metal-Oxide nanowire 216 can comprise ZnO, TiO2, carbon nanotube and/or VO2 and the length can be ~10-100 nm.

Still referring to FIG. 2, in various examples the electrode 212 can comprise Ag, Au, Cu, Pd, and/or Pt.

Still referring to FIG. 2, in various examples the electrode 214 can comprise Ag, Au, Cu, Pd, and/or Pt.

Figure 3:
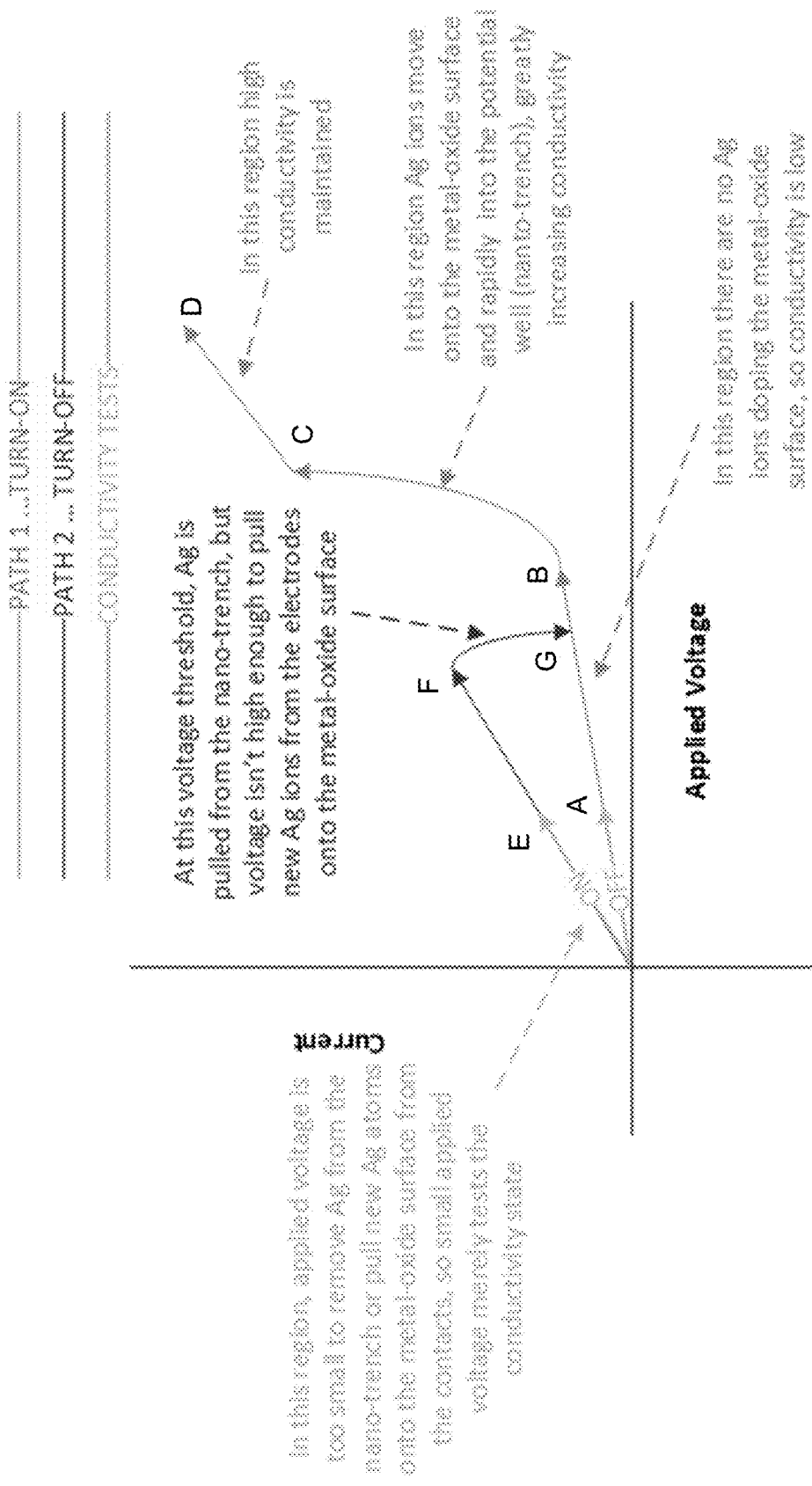
FIG. 3 shows current-voltage (I-V) relationships 300 for a memristive device according to an embodiment. A "TURN ON" path is shown from the origin (the intersection of the x-axis and the y-axis) to point A, then to point B, then to point C, then to point D. In addition, a "TURN-OFF" path is shown from the origin to point E, then to point F, then to point G (which is in the region between points A and B). In addition, two "CONDUCTIVITY TEST" paths are shown. One "CONDUCTIVITY TEST" path is from the origin to point A. Another "CONDUCTIVITY TEST" path is from the origin to point E.

Referring now to FIG. 3, this shows examples of various current-voltage (I-V) relationships 300 associated with the memristive device of FIG. 2 according to an embodiment (these I-V relationships of FIG. 3 can also generally represent the behavior of a mesh-type device such as described herein; in such a mesh configuration, there would typically be a higher current for the ON state; in addition, in such a mesh configuration the ON and OFF states would typically be separated by a larger amount). Path 1 is the "TURN-ON" path. This Path 1 goes from the origin (intersection of x-axis and y-axis) to point A, then to point B (through point G), then to point C, then to point D. Path 1 shows an initially low-conductivity state. Path 1 also shows that at a threshold voltage, Ag ions move from the metallic electrode onto the metal-oxide substrate where they migrate over the full length of the nanowires and rapidly settle in the potential well of the nanowire gap. This is a thermodynamic process and takes time for full-length migration over the nanowire base material. This determines a fundamental reaction time for the device. Some Ag ions reside on the open metal-oxide surface and the overall conductivity of the memristor increases by several orders of magnitude. Having "SET" the device to a high state with a high voltage, the device can then be turned off using a lower "RESET" voltage, but one still high enough to pull Ag ions from the potential well, across the metal-oxide surface and onto an electrode. This voltage isn't high enough to pull Ag ions from the electrode at the opposite end onto the metal-oxide surface, so conductivity drops significantly which effects a low device state. This is depicted by Path 2, the "TURN-OFF" path in this FIG. 3. This Path 2 goes from the origin to point E, then to point F. If the voltage shown on Path 2 were to be increased from point F, the Ag ions would again be pulled onto the metal-oxide surface and the device would again be in the "ON" state (see the path from point G to point B, then to point C, then to point D). Again, this migration of ions of Path 2 takes time and is slower than the movement of electrons or current in some electronic devices. In one example, lithium can be used as a material for one or more of the electrodes, because lighter Li atoms are able to move faster than Ag across the base material. Whether the device is in the "ON" or "OFF" state, small voltages can be applied to test the conductivity (see Path 3, which is a conductivity test from the origin to point A; see also path 4, which is a conductivity test from the origin to point E). Such small voltages can be selected such that they are not sufficiently strong to either pull Ag ions from the potential well or to pull Ag ions from the electrodes onto the metal-oxide substrate.

Manufacturing of the two-nanowire device shown in FIG. 2 can require higher precision than constructing a device based on a mesh of, for example, ZnO nanowires (see FIGS. 4A and 4B). In this embodiment, this nanowire mesh (comprising the top row of nanowires seen in FIG. 4A and the bottom row of nanowires seen in FIG. 4B) that is on a $SiO_2$ substrate 420 serves as a set of gaps formed by overlapped ZnO nanowires to trap Ag ions migrating along the paths (the nanowires are dispersed between electrodes 412 and 414). In FIGS. 4A and 4B the Ag ions are represented by gray circles, mostly captured by the potential well in ZnO nanowire gaps. The conducting mechanism remains the same as in the case of the two-nanowire device. The conducting path now, however, is formed by a collection of connected nanowires, spanning the region between Ag contacts (electrodes). Multiple conducting paths formed between Ag contacts (electrodes) results in higher ON/OFF ratio. The path depicted by the four nanowires in the view of FIG. 4B corresponds to the top row of four nanowires in the view of FIG. 4A.

Figure 5:
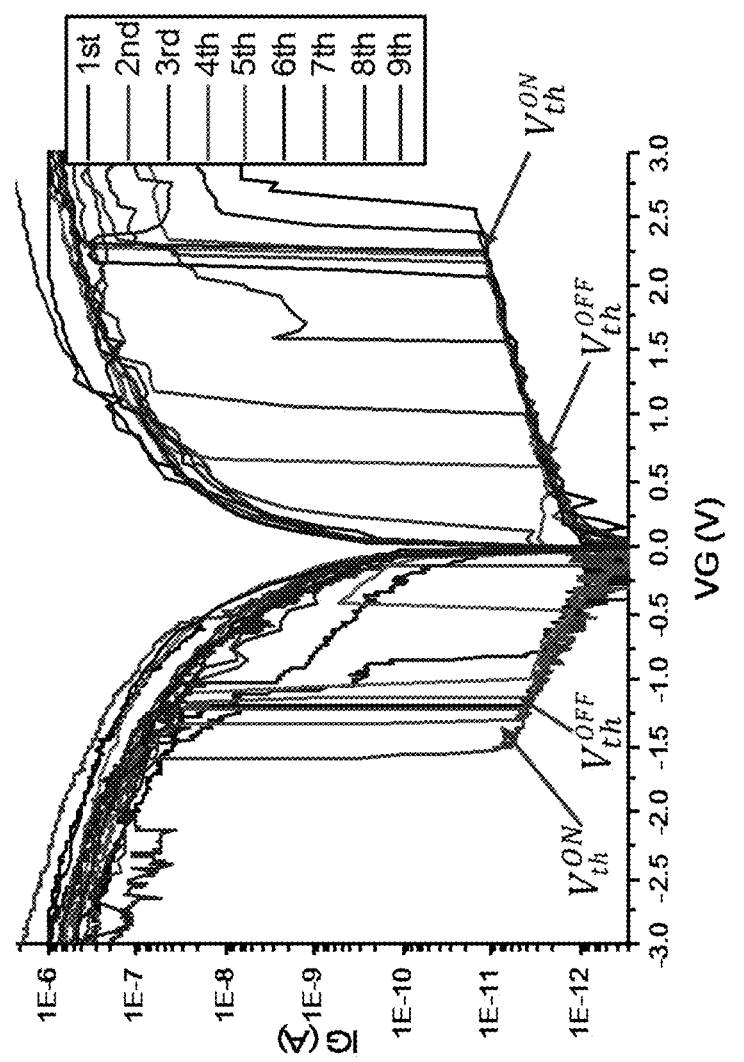
FIG. 5 shows current vs swept voltage of a nanowire mesh according to an embodiment. This FIG. 5 can be viewed as a collection of trenches, showing a persistent opening of conducting channels.

Referring now to FIG. 5, this FIG. shows actual lab measurements for a general type of the device design shown in FIGS. 4A and 4B (the measurements can be thought of in the context of a "proxy" which describes the physics mechanism and which gives confidence that various configurations described herein would operate as envisioned). This FIG. 5 demonstrates the states of conductivity resulting from application of voltages and illustrates the underlying mechanism for the embodiment of the device of FIGS. 4A and 4B. What is seen is conductivity shifting by orders of magnitude when the Ag ions move onto and off of the nanowire mesh and substrate material. The voltage sweeps were very fast which is why ON and OFF voltages are seen varying on different voltage sweeps. Remember, the migration of ions takes microseconds instead of nanoseconds and if the voltage is sweeping too quickly (as it is in this FIG. 5) the device exhibits hysteresis and the ON and OFF voltages will be affected by that hysteresis. The time it takes to set the device to ON can be faster than the time it takes set the device to OFF, because an arbitrarily high voltage can be applied to draw ions off of the electrode material onto the base material/nanowire(s). To RESET the device to OFF, an arbitrarily high voltage can't be used and instead a voltage less than the SET voltage must be used. This means it takes more time for ions to move off of the nanowire and base material, causing the RESET time to be longer. The purpose of FIG. 5, is simply to demonstrate that driving metallic ions onto a semiconductor surface and into nanowire trenches (e.g., two aligned, parallel nanowires) results in several orders of magnitude changes of conductivity for these structures. In one specific example, Ag ions will move everywhere (that is, including the substrate and the nanowire(s)) but the Ag ions will get captured only at the nanotrench(es). In FIG. 5, starting from non-conductive state and following the line as voltage increases from 0 to a threshold value $V_{th}^{ON}$ of approximately 2.1V, conductivity jumps several orders of magnitude due to formation of conducting channels (also shown in FIG. 3 as Path 1 (Turn-ON)). When the device is already in the conductive state, the voltage is reduced and conductivity is seen to drop by orders of magnitude (also shown as the RESET voltage in FIG. 3 on Path 2 (Turn-OFF)) at a threshold value $V_{th}^{OFF}$ of ~0.7V which will force Ag ions out of the nanowire well (gap). However, this voltage is not high enough for Ag ions to get over the potential barrier at the electrode contact, returning the device to non-conductive state. This device will stay in the OFF state until it reaches $V_{th}^{ON}$ which switches the device back ON at $V_{th}^{ON}$. Multiple voltage sweeps in both directions show the opening/closing of multiple conductive paths in FIG. 5.

As described herein, if the metallic ends (such as each pair of electrodes across which voltages are applied) use different materials, the device will have different behavior for positive and negative voltages. The use of dissimilar metals for the electrodes has the benefit of ensuring the ions from one electrode have greater difficulty jumping the associated potential barrier. In one embodiment, dissimilar materials can be used at each end of a given memristor so that the potential barrier on the electrode which offers ions to the substrate/nanowire(s) is higher than the other end. Using a RESET voltage to draw metallic ions off of the substrate/nanowire(s) involves energy to get the ions out of the potential well, but also off of the exit electrode. If this total energy is notably lower than the energy required to jump the potential barrier at the entry electrode, this helps ensure a wider separation between the ON and OFF voltages. In addition to the design of the nanowire gap length and width, the selection of these electrode materials provides a secondary mechanism for tuning the desired SET and RESET voltages for the device.

In various embodiments, as a matter of practical implementation, since these can be nano-scale devices, irregularities in manufacturing can be compensated by the simple observation of the changing conductivity when setting and resetting the device states. In one example, the SET voltage can be sufficiently high to guarantee a SET condition on all memristors while the RESET voltage could involve increasing the voltage until the conductivity of the device is observed to drop (at which point the desired condition is achieved).

In another embodiment, a device can have a layout that takes advantage of one or more of the principles described herein. One of the advantages of an embodiment of the memory type described herein can be that it requires significantly less expensive manufacturing process (compared to traditional defect-based memristors). Another advantage of an embodiment of the memory type described herein is the possibility to control the electrode/nanomesh spatial arrangement to achieve exponential memory expansion.

Figure 6:
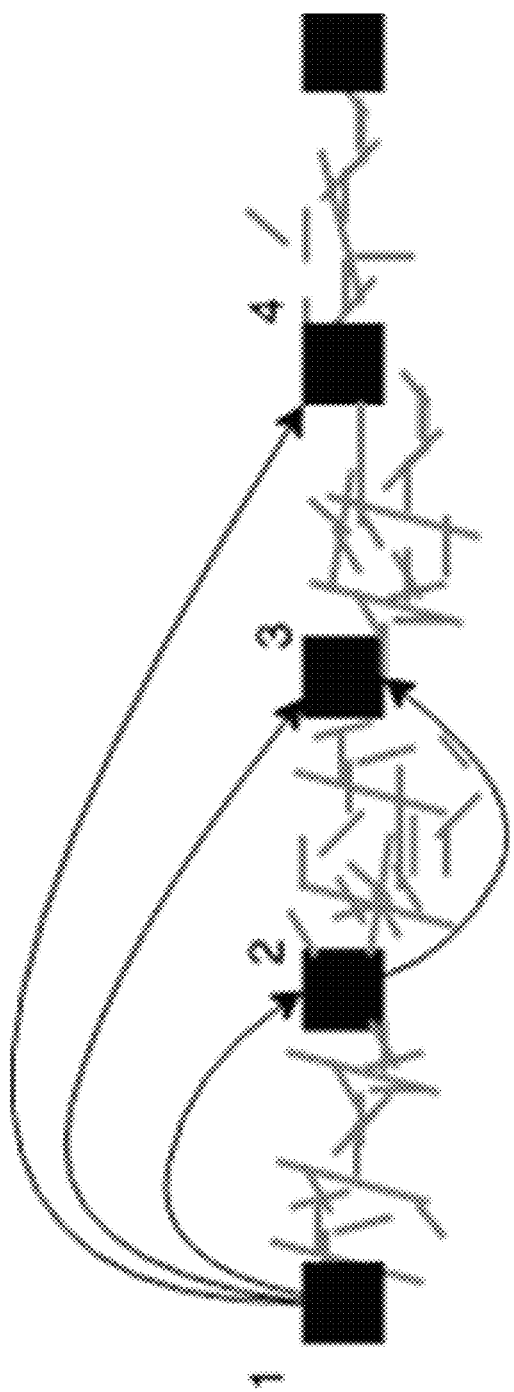
FIG. 6 shows a representation of a linear device according to an embodiment. In this FIG. 6, contacts 1 . . . 4 are depicted as squares spread across a substrate. The nanowires are depicted as the elongated elements disbursed between the squares. The fifth, unnumbered contact (rightmost square in the FIG.) indicates that the number of contacts (and associated nanowire groups) can increase to any appropriate desired amount.

Referring now to FIG. 6, this demonstrates a simplified linear layout of an embodiment of the device. It is shown that as the number of electrodes N increases, the memory storage capacity grows as $$M = \sum_{1}^{N-1} i = \frac{1}{2}(N-1)N.$$

After the regions are electroformed, distinct states can be created by applying write voltages to electrodes 1-2, 1-3, ..., 1-(N) resulting in N−1 states, then 2-3, 2-4, ..., 2-N resulting in N−2 states, etc. As an example, a write step which employs electrodes 1-2 will create a state 100 ... 0, while electrodes 1-N will create state 111 ... 1. Such process can create $$\frac{1}{2}(N-1)N$$

states.

Figure 7B:
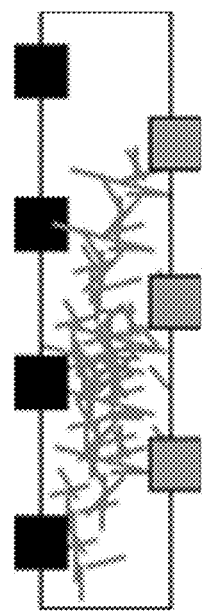
FIGS. 7A and 7B show devices according to embodiments, wherein the devices of these embodiments have a multi-layer hexagonal configuration with top contacts (black squares) and bottom contacts (hollow or gray squares).
Figure 7A:
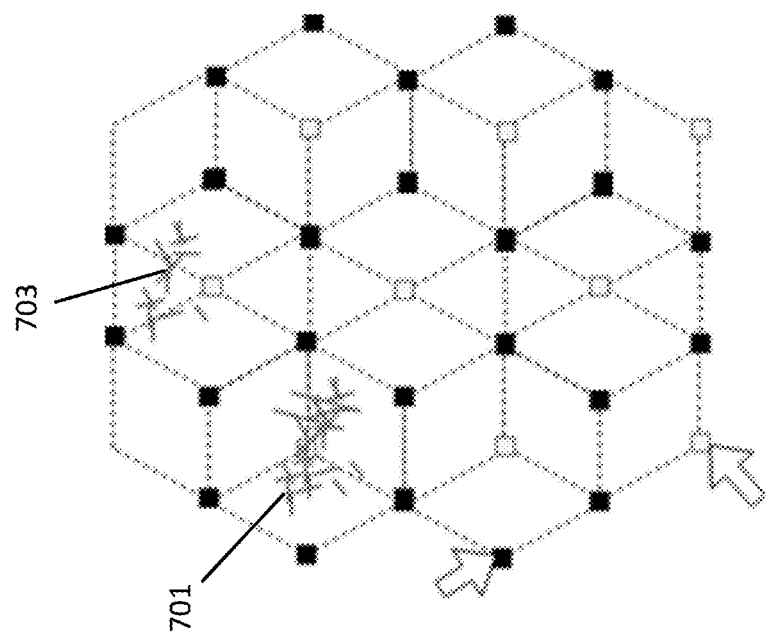

While the linear electrode arrangement described herein provides one embodiment, a more efficient realization (see FIGS. 7A and 7B) can be a device with top and bottom arrays of electrodes (e.g., forming two honeycomb lattices). As shown in FIGS. 7A and 7B, two electrodes from opposite sides (e.g., top side and bottom side) can be chosen for read-write operations. With N electrodes on each side, up to $M=N^2$ states can be achieved. In one example, there can be a path along nanowire mesh "islands" that can span multiple contacts, sufficient for conductivity across the entire device. In the view of FIG. 7A, two representative "islands" 701 and 703 are shown. In one example, there could be a large mesh formed of many such interconnected "islands". FIG. 7B shows a view of a single nanowire mesh spanning and connecting to multiple top electrodes and spanning and connecting to multiple bottom electrodes.

As described herein, various embodiments provide a memristor that is manufacturable, stable, has low manufacturing cost, and requires no energy for memory maintenance.

As described herein, various embodiments provide a simple assembly that provides a low resistance and a high resistance that are orders of magnitude apart.

As described herein, various embodiments provide for ion migration from one or more electrodes across one or more nanowires on the surfaces of the nanowires (as opposed to ion migration inside a modified material).

As described herein, various embodiments provide for doping (ion migration) on a surface (as opposed to bulk diffusion).

As described herein, various embodiments provide for selective control of the conductivity of one or more nanowires.

As described herein, various embodiments provide useful geometries, such as, for example, a mesh nanowire geometry, a linear electrode geometry, a hexagonal electrode geometry and/or a honeycomb electrode geometry.

As described herein, various embodiments provide for a choice of SET, READ, RESET voltages and a choice of geometrically overlapping nanowires.

In one example, a device can be manufactured by first placing one or more nanowires (such as on a substrate) and then placing the electrodes (such as on the substrate).

In one example, a device can be manufactured by "sprinkling" nanowires (such as nanowire pairs or groups of nanowires) on a substrate. In one specific example, the nanowires can initially and individually be semiconductors (that is, by default, before applying a setting voltage, such nanowires can be poor conductors).

In one example, a device can be manufactured by placing nanowires (or nanorods or nanotubes) in suspension and then placing on a substrate. In one specific example, distribution can be controlled. In another specific example, a magnetic field can be used to control the geometric arrangement.

In one example, the more uniform the mesh, the closer together the electrodes can be (e.g., 100 um).

In one example, each nanowire can be a fraction of a um (in length and in width/diameter).

In one example, a length of a single given nanowire can be about 10 nm.

In one example, spacing between a pair of electrodes can be about 10 times the length (e.g., average length) of each of the nanowires between the electrodes.

In one example, the spacing between a pair of electrodes can be 100 nm.

In one example, the nanowires between a pair of electrodes can have a distribution that is sufficiently uniform to produce replication of a word (or other memory unit) that has been programmed into the device.

In one example, a gap between a nanowire and another nanowire (see e.g., gap 210 in FIG. 2) can be approximately 1 nm.

In one example, the nanowires can be homogenous wires (or rods or tubes).

In one example, the nanowires and electrodes can be deterministically placed.

In one example, each electrode pair can represent 1 bit of memory.

In one example, the device can be massively parallel.

In one example, certain geometries can provide order of $n^2$ memory states (where n equals the number of electrodes).

In one example, a memory state can be determined by reading a resistance between a pair of electrodes in a honeycomb.

In one example (related to nanowire meshes or groups), the greater the number of nanowires the higher the likelihood of predictable operation.

In one example, the use of multiple electrodes can result in multi-bit devices.

In one example, a device can store 2 bits of information in a 3 electrode configuration.

In one example, a device can provide for the storage of words, rather than just bits (see, e.g., FIGS. 7A and 7B).

In one example, multiple layers of electrodes can be used (e.g., two or more layers of electrodes).

In one example, a device can utilize multiple sandwiched layers.

In one example, approximately 1-2 volts can be used for electroforming (turn ON).

In one example, approximately 0.2-0.5 volts can be used to turn OFF.

In one example, a read voltage (to test conductivity state) can be an order of magnitude less than the turn OFF voltage.

In one example, initial electroforming can be used to bring out Ag ions (e.g., electroforming can move ions from contacts (electrodes) to substrate and nanowire(s)). In another example, read/write can be used mostly to redistribute the Ag by moving the ions out of nanogaps. In another example, the initial electroforming can require a higher voltage than the read/write operations.

In one example, the memristor can be a flexible device (e.g., the substrate upon which the nanowire(s) are located can be thin and flexible).

In one example, the memristor can be a conformal device (e.g., the e.g., the substrate upon which the nanowire(s) are located can be bent to conform to a surface).

In one example, one or more elements of the memristor (e.g., the nanowire(s)) can be applied via spraying).

In one example, ions (e.g., Ag ions) may get onto the substrate upon which the nanwire(s) are located, but such ions will not (in this example) affect conductivity due to the very high mobility of the ions and no nanotrenches (in the substrate of this example).

As described herein, various devices can utilize nanowires(s), which nanowire(s) can provide more control over the creation of a desired geometry (that is, more control as compared to certain bulk material applications).

As described herein, utilization of surface ion migration can take approximately 2 orders of magnitude less energy (as compared to certain bulk material applications). In addition, as described herein, utilization of surface ion migration can result in faster operation (as compared to certain bulk material applications). In this regard, it is noted that in certain bulk material applications it can be difficult to create defects in the bulk material (this can often take a lot of energy and a relatively long time).

As described herein, various devices can be operated in the context of various current-voltage relationships. For example (see FIG. 3), in one region (which goes from the origin (intersection of x-axis and y-axis) to point A, then to point B (through point G), there are no Ag ions doping the metal-oxide surface, so conductivity is low. In another region (which goes from point B to point C), Ag ions move onto the metal-oxide surface and rapidly into the potential well (nanotrench), greatly increasing conductivity. In another region (which goes from point C to point D), high conductivity is maintained. In another region (which goes from the origin to point A and which goes from the origin to point E), the applied voltage is too small to remove Ag from the nanotrench or pull new Ag ions onto the metal-oxide surface from the contacts (electrodes), so the small applied voltage merely tests the conductivity state. In another region (which goes from point F to point G), at the voltage threshold of point F, Ag is pulled from the nanotrench, but the voltage is not high enough to pull new Ag ions from the contacts (electrodes) onto the metal-oxide surface.

As described herein, the nanowire mesh can be viewed (and/or implemented) as a materials-based neural network device. In one example, the neural network device can be applied in various applications. In one example, the neural network device can retain low cost and have a relatively simple structure.

Referring now to FIG. 8, various steps of a method 800 according to an embodiment are shown. As seen in this FIG. 8, step 802 comprises applying, by a processing system including a processor, a first setting voltage across a pair of electrodes, wherein the pair of electrodes comprises a first electrode and a second electrode, wherein a first nanowire with a first electrical resistance is electrically connected between the first electrode and the second electrode, wherein the applying of the first setting voltage causes a migration of ions from one or more of the first electrode and the second electrode to a surface of the first nanowire, and wherein the migration of ions effectuates a reduction of electrical resistance of the first nanowire from a first electrical resistance to a second electrical resistance that is lower than the first electrical resistance. Next, step 804 comprises applying, by the processing system, a first reading voltage across the pair of electrodes, wherein the first reading voltage is less than the first setting voltage, and wherein the first reading voltage is sufficiently small such that the applying of the first reading voltage causes no more than an insignificant change of the electrical resistance of the first nanowire from the second electrical resistance.

While for purposes of simplicity of explanation, the respective processes are shown and described as a series of blocks in FIG. 8, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein.

Figure 9:
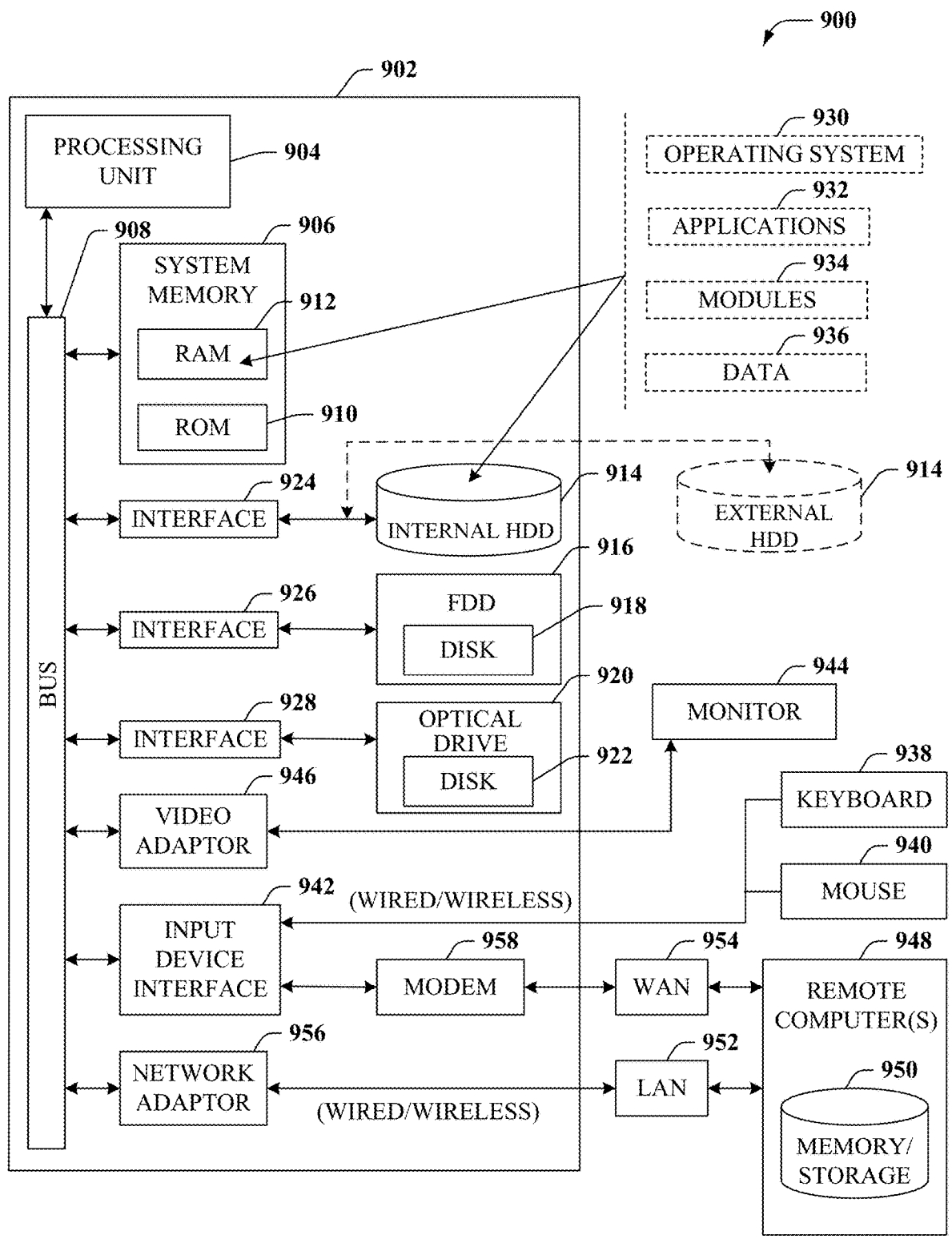
FIG. 9 is a block diagram of an example, non-limiting embodiment of a computing environment in accordance with various aspects described herein.

Turning now to FIG. 9, there is illustrated a block diagram of a computing environment in accordance with various aspects described herein. In order to provide additional context for various embodiments of the embodiments described herein, FIG. 9 and the following discussion are intended to provide a brief, general description of a suitable computing environment 900 in which the various embodiments of the subject disclosure can be implemented. Each of these devices can be implemented via computer-executable instructions that can run on one or more computers, and/or in combination with other program modules and/or as a combination of hardware and software. For example, computing environment 900 can facilitate in whole or in part applying voltages (e.g., setting voltages, reading voltages and/or reset voltages) to a memristive device.

Generally, program modules comprise routines, programs, components, data structures, etc., that perform particular tasks or implement particular abstract data types. Moreover, those skilled in the art will appreciate that the inventive methods can be practiced with other computer system configurations, comprising single-processor or multiprocessor computer systems, minicomputers, mainframe computers, as well as personal computers, hand-held computing devices, microprocessor-based or programmable consumer electronics, and the like, each of which can be operatively coupled to one or more associated devices.

As used herein, a processing circuit includes one or more processors as well as other application specific circuits such as an application specific integrated circuit, digital logic circuit, state machine, programmable gate array or other circuit that processes input signals or data and that produces output signals or data in response thereto. It should be noted that while any functions and features described herein in association with the operation of a processor could likewise be performed by a processing circuit.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically comprise a variety of media, which can comprise computer-readable storage media and/or communications media, which two terms are used herein differently from one another as follows. Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data or unstructured data.

Computer-readable storage media can comprise, but are not limited to, random access memory (RAM), read only memory (ROM), electrically erasable programmable read only memory (EEPROM), flash memory or other memory technology, compact disk read only memory (CD-ROM), digital versatile disk (DVD) or other optical disk storage, magnetic cassettes, magnetic tape, magnetic disk storage or other magnetic storage devices or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communication media comprise wired media, such as a wired network or direct-wired connection, and wireless media such as acoustic, RF, infrared and other wireless media.

With reference again to FIG. 9, the example environment can comprise a computer 902, the computer 902 comprising a processing unit 904, a system memory 906 and a system bus 908. The system bus 908 couples system components including, but not limited to, the system memory 906 to the processing unit 904. The processing unit 904 can be any of various commercially available processors. Dual microprocessors and other multiprocessor architectures can also be employed as the processing unit 904.

The system bus 908 can be any of several types of bus structure that can further interconnect to a memory bus (with or without a memory controller), a peripheral bus, and a local bus using any of a variety of commercially available bus architectures. The system memory 906 comprises ROM 910 and RAM 912. A basic input/output system (BIOS) can be stored in a non-volatile memory such as ROM, erasable programmable read only memory (EPROM), EEPROM, which BIOS contains the basic routines that help to transfer information between elements within the computer 902, such as during startup. The RAM 912 can also comprise a high-speed RAM such as static RAM for caching data.

The computer 902 further comprises an internal hard disk drive (HDD) 914 (e.g., EIDE, SATA), which internal HDD 914 can also be configured for external use in a suitable chassis (not shown), a magnetic floppy disk drive (FDD) 916, (e.g., to read from or write to a removable diskette 918) and an optical disk drive 920, (e.g., reading a CD-ROM disk 922 or, to read from or write to other high capacity optical media such as the DVD). The HDD 914, magnetic FDD 916 and optical disk drive 920 can be connected to the system bus 908 by a hard disk drive interface 924, a magnetic disk drive interface 926 and an optical drive interface 928, respectively. The hard disk drive interface 924 for external drive implementations comprises at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 902, the drives and storage media accommodate the storage of any data in a suitable digital format. Although the description of computer-readable storage media above refers to a hard disk drive (HDD), a removable magnetic diskette, and a removable optical media such as a CD or DVD, it should be appreciated by those skilled in the art that other types of storage media which are readable by a computer, such as zip drives, magnetic cassettes, flash memory cards, cartridges, and the like, can also be used in the example operating environment, and further, that any such storage media can contain computer-executable instructions for performing the methods described herein.

A number of program modules can be stored in the drives and RAM 912, comprising an operating system 930, one or more application programs 932, other program modules 934 and program data 936. All or portions of the operating system, applications, modules, and/or data can also be cached in the RAM 912. The systems and methods described herein can be implemented utilizing various commercially available operating systems or combinations of operating systems.

A user can enter commands and information into the computer 902 through one or more wired/wireless input devices, e.g., a keyboard 938 and a pointing device, such as a mouse 940. Other input devices (not shown) can comprise a microphone, an infrared (IR) remote control, a joystick, a game pad, a stylus pen, touch screen or the like. These and other input devices are often connected to the processing unit 904 through an input device interface 942 that can be coupled to the system bus 908, but can be connected by other interfaces, such as a parallel port, an IEEE 1394 serial port, a game port, a universal serial bus (USB) port, an IR interface, etc.

A monitor 944 or other type of display device can be also connected to the system bus 908 via an interface, such as a video adapter 946. It will also be appreciated that in alternative embodiments, a monitor 944 can also be any display device (e.g., another computer having a display, a smart phone, a tablet computer, etc.) for receiving display information associated with computer 902 via any communication means, including via the Internet and cloud-based networks. In addition to the monitor 944, a computer typically comprises other peripheral output devices (not shown), such as speakers, printers, etc.

The computer 902 can operate in a networked environment using logical connections via wired and/or wireless communications to one or more remote computers, such as a remote computer(s) 948. The remote computer(s) 948 can be a workstation, a server computer, a router, a personal computer, portable computer, microprocessor-based entertainment appliance, a peer device or other common network node, and typically comprises many or all of the elements described relative to the computer 902, although, for purposes of brevity, only a remote memory/storage device 950 is illustrated. The logical connections depicted comprise wired/wireless connectivity to a local area network (LAN) 952 and/or larger networks, e.g., a wide area network (WAN) 954. Such LAN and WAN networking environments are commonplace in offices and companies, and facilitate enterprise-wide computer networks, such as intranets, all of which can connect to a global communications network, e.g., the Internet.

When used in a LAN networking environment, the computer 902 can be connected to the LAN 952 through a wired and/or wireless communication network interface or adapter 956. The adapter 956 can facilitate wired or wireless communication to the LAN 952, which can also comprise a wireless AP disposed thereon for communicating with the adapter 956.

When used in a WAN networking environment, the computer 902 can comprise a modem 958 or can be connected to a communications server on the WAN 954 or has other means for establishing communications over the WAN 954, such as by way of the Internet. The modem 958, which can be internal or external and a wired or wireless device, can be connected to the system bus 908 via the input device interface 942. In a networked environment, program modules depicted relative to the computer 902 or portions thereof, can be stored in the remote memory/storage device 950. It will be appreciated that the network connections shown are example and other means of establishing a communications link between the computers can be used.

The computer 902 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This can comprise Wireless Fidelity (Wi-Fi) and BLUETOOTH® wireless technologies. Thus, the communication can be a predefined structure as with a conventional network or simply an ad hoc communication between at least two devices.

Wi-Fi can allow connection to the Internet without wires. Wi-Fi is a wireless technology similar to that used in a cell phone that enables such devices, e.g., computers, to send and receive data indoors and out; anywhere within the range of a base station. Wi-Fi networks use radio technologies called IEEE 802.11 (a, b, g, n, ac, ag, etc.) to provide secure, reliable, fast wireless connectivity. A Wi-Fi network can be used to connect computers to each other, to the Internet, and to wired networks (which can use IEEE 802.3 or Ethernet). Wi-Fi networks operate in the unlicensed 2.4 and 5 GHz radio bands for example or with products that contain both bands (dual band), so the networks can provide real-world performance similar to the basic 10BaseT wired Ethernet networks used in many offices.

The terms "first," "second," "third," and so forth, as used in the claims, unless otherwise clear by context, is for clarity only and doesn't otherwise indicate or imply any order in time. For instance, "a first determination," "a second determination," and "a third determination," does not indicate or imply that the first determination is to be made before the second determination, or vice versa, etc.

In the subject specification, terms such as "store," "storage," "data store," data storage," "database," and substantially any other information storage component relevant to operation and functionality of a component, refer to "memory components," or entities embodied in a "memory" or components comprising the memory. It will be appreciated that the memory components described herein can be either volatile memory or nonvolatile memory, or can comprise both volatile and nonvolatile memory, by way of illustration, and not limitation, volatile memory, non-volatile memory, disk storage, and memory storage. Further, non-volatile memory can be included in read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

Moreover, it will be noted that the disclosed subject matter can be practiced with other computer system configurations, comprising single-processor or multiprocessor computer systems, mini-computing devices, mainframe computers, as well as personal computers, hand-held computing devices (e.g., PDA, phone, smartphone, watch, tablet computers, netbook computers, etc.), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

As used in some contexts in this application, in some embodiments, the terms "component," "system" and the like are intended to refer to, or comprise, a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, computer-executable instructions, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components. While various components have been illustrated as separate components, it will be appreciated that multiple components can be implemented as a single component, or a single component can be implemented as multiple components, without departing from example embodiments.

Further, the various embodiments can be implemented as a method, apparatus or article of manufacture using standard programming and/or engineering techniques to produce software, firmware, hardware or any combination thereof to control a computer to implement the disclosed subject matter. The term "article of manufacture" as used herein is intended to encompass a computer program accessible from any computer-readable device or computer-readable storage/communications media. For example, computer readable storage media can include, but are not limited to, magnetic storage devices (e.g., hard disk, floppy disk, magnetic strips), optical disks (e.g., compact disk (CD), digital versatile disk (DVD)), smart cards, and flash memory devices (e.g., card, stick, key drive). Of course, those skilled in the art will recognize many modifications can be made to this configuration without departing from the scope or spirit of the various embodiments.

In addition, the words "example" and "exemplary" are used herein to mean serving as an instance or illustration. Any embodiment or design described herein as "example" or "exemplary" is not necessarily to be construed as preferred or advantageous over other embodiments or designs. Rather, use of the word example or exemplary is intended to present concepts in a concrete fashion. As used in this application, the term "or" is intended to mean an inclusive "or" rather than an exclusive "or". That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

As employed herein, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components or any combination thereof designed to perform the functions described herein. Processors can exploit nano-scale architectures such as, but not limited to, molecular and quantum-dot based transistors, switches and gates, in order to optimize space usage or enhance performance of user equipment. A processor can also be implemented as a combination of computing processing units.

What has been described above includes mere examples of various embodiments. It is, of course, not possible to describe every conceivable combination of components or methodologies for purposes of describing these examples, but one of ordinary skill in the art can recognize that many further combinations and permutations of the present embodiments are possible. Accordingly, the embodiments disclosed and/or claimed herein are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

As may also be used herein, the term(s) "operably coupled to", "coupled to", and/or "coupling" includes direct coupling between items and/or indirect coupling between items via one or more intervening items. Such items and intervening items include, but are not limited to, junctions, communication paths, components, circuit elements, circuits, functional blocks, and/or devices. As an example of indirect coupling, a signal conveyed from a first item to a second item may be modified by one or more intervening items by modifying the form, nature or format of information in a signal, while one or more elements of the information in the signal are nevertheless conveyed in a manner than can be recognized by the second item. In a further example of indirect coupling, an action in a first item can cause a reaction on the second item, as a result of actions and/or reactions in one or more intervening items.

Although specific embodiments have been illustrated and described herein, it should be appreciated that any arrangement which achieves the same or similar purpose may be substituted for the embodiments described or shown by the subject disclosure. The subject disclosure is intended to cover any and all adaptations or variations of various embodiments. Combinations of the above embodiments, and other embodiments not specifically described herein, can be used in the subject disclosure. For instance, one or more features from one or more embodiments can be combined with one or more features of one or more other embodiments. In one or more embodiments, features that are positively recited can also be negatively recited and excluded from the embodiment with or without replacement by another structural and/or functional feature. The steps or functions described with respect to the embodiments of the subject disclosure can be performed in any order. The steps or functions described with respect to the embodiments of the subject disclosure can be performed alone or in combination with other steps or functions of the subject disclosure, as well as from other embodiments or from other steps that have not been described in the subject disclosure. Further, more than or less than all of the features described with respect to an embodiment can also be utilized.

What is claimed is:

1. A method, comprising:
    applying, by a processing system including a processor, a first setting voltage across a pair of electrodes, the pair of electrodes comprising a first electrode and a second electrode, a first nanowire with a first electrical resistance being electrically connected between the first electrode and the second electrode, a second nanowire being disposed adjacent to the first nanowire, the second nanowire being disposed substantially parallel to the first nanowire, a gap being formed between the first nanowire and the second nanowire, the applying of the first setting voltage causing a migration of ions from one or more of the first electrode and the second electrode to a surface of the first nanowire, the second nanowire being configured to force at least some of the ions to settle in a potential well at a location along the first nanowire, the migration of ions causing a reduction of electrical resistance of the first nanowire from the first electrical resistance, and the reduction of the electrical resistance of the first nanowire causing entry into a first memory state of a device comprising the first nanowire and the second nanowire; and
    applying, by the processing system, a first reading voltage across the pair of electrodes, the first reading voltage being less than the first setting voltage, the first reading voltage being sufficiently small such that the applying of the first reading voltage causes a change of the electrical resistance of the first nanowire while still maintaining the first memory state.

2. The method of claim 1, wherein:
    the at least some of the ions experience a simultaneous interaction with both the first nanowire and the second nanowire;
    the reduction of the electrical resistance of the first nanowire from the first electrical resistance is to a second electrical resistance that is lower than the first electrical resistance;
    the applying of the first reading voltage causes a change of the electrical resistance of the first nanowire from the second electrical resistance to a third electrical resistance that is lower than the first electrical resistance;
    the third electrical resistance is no greater than 10% above the second electrical resistance;
    the first reading voltage is sufficiently small such that the applying of the first reading voltage causes a removal from a vicinity of the gap of no more than an insignificant amount of the ions; and
    the insignificant amount of the ions is no greater than 10% of an existing concentration of the ions at the vicinity of the gap.

3. The method of claim 1, wherein the first reading voltage is sufficiently small such that the applying of the first reading voltage causes no more than an insignificant amount of additional ions to migrate from one or more of the first electrode and the second electrode to the surface of the first nanowire, and wherein the insignificant amount is no greater than 10% of an existing concentration of the ions on the surface of the first nanowire.

4. The method of claim 1, further comprising applying, by the processing system, a resetting voltage across the pair of electrodes, wherein:
    the reduction of the electrical resistance of the first nanowire from the first electrical resistance is to a second electrical resistance that is lower than the first electrical resistance;
    the applying of the first reading voltage causes a change of the electrical resistance of the first nanowire from the second electrical resistance to a third electrical resistance that is lower than the first electrical resistance;
    the resetting voltage is less than the first setting voltage and greater than the first reading voltage; and
    the applying the resetting voltage causes entry into a second memory state by effectuating a change of the electrical resistance of the first nanowire to another electrical resistance that is closer in value to the first electrical resistance than to the third electrical resistance.

5. The method of claim 4, wherein the third electrical resistance is substantially equal to the second electrical resistance, and wherein the another electrical resistance is substantially equal to the first electrical resistance.

6. The method of claim 4, wherein the resetting voltage is sufficiently small such that the applying of the resetting voltage causes no more than an insignificant amount of additional ions to migrate from one or more of the first electrode and the second electrode to the surface of the first nanowire, and wherein the insignificant amount is no greater than 10% of an existing concentration of the ions on the surface of the first nanowire.

7. The method of claim 4, wherein the resetting voltage is sufficiently large such that the applying of the resetting voltage causes a significant number of the ions to be removed from a vicinity of the gap, and wherein the significant number results in a decrease by more than 90% of an existing concentration of the ions at the vicinity of the gap.

8. The method of claim 7, further comprising:
    applying, by the processing system, a second reading voltage across the pair of electrodes, wherein the second reading voltage is less than the first setting voltage, wherein the second reading voltage is sufficiently small such that the applying of the second reading voltage causes no more than an insignificant change of the electrical resistance of the first nanowire from the another electrical resistance, and wherein the insignificant change is a change of no greater than 10% from the another electrical resistance.

9. The method of claim 8, further comprising:
    applying, by the processing system, a second setting voltage across the pair of electrodes, wherein the applying of the second setting voltage causes another migration of other ions from one or more of the first electrode and the second electrode to the surface of the first nanowire, and wherein the another migration of other ions effectuates another reduction of electrical resistance of the first nanowire from the another electrical resistance to a different electrical resistance that is lower than the another electrical resistance.

10. The method of claim 1, wherein:
the first electrode comprises one of Ag, Au, Cu, Pd, Pt, or any combination thereof; and
the second electrode comprises one of Ag, Au, Cu, Pd, Pt, or any combination thereof.

11. The method of claim 1, wherein:
the first nanowire comprises one or more of ZnO, $TiO_2$, carbon nanotube, $VO_2$, or any combination thereof; and
the second nanowire comprises one or more of ZnO, $TiO_2$, carbon nanotube, $VO_2$, or any combination thereof.

12. A device, comprising:
a processing system including a processor; and
a memory that stores executable instructions that, when executed by the processing system, facilitate performance of operations, the operations comprising:
applying a first setting voltage across a first electrode and a second electrode, a first nanowire with a first electrical resistance being electrically connected between the first electrode and the second electrode, a second nanowire being disposed adjacent to the first nanowire, the second nanowire being disposed substantially parallel to the first nanowire, a gap being formed between the first nanowire and the second nanowire, a migration of ions from one or more of the first electrode and the second electrode to a surface of the first nanowire being caused by the applying of the first setting voltage, the second nanowire being configured to force at least some of the ions to settle in a potential well at a location along the first nanowire, the migration of ions causing a reduction of electrical resistance of the first nanowire from the first electrical resistance, and the reduction of the electrical resistance of the first nanowire causing entry into a first memory state of a memory device comprising the first nanowire and the second nanowire; and
applying, across the first electrode and the second electrode, a first reading voltage, the first reading voltage being less than the first setting voltage, the first reading voltage being sufficiently small such that the applying of the first reading voltage causes a change of the electrical resistance of the first nanowire while still maintaining the first memory state.

13. The device of claim 12, wherein the operations further comprise applying a resetting voltage across the first electrode and the second electrode, wherein:
the reduction of the electrical resistance of the first nanowire from the first electrical resistance is to a second electrical resistance that is lower than the first electrical resistance;
the applying of the first reading voltage causes a change of the electrical resistance of the first nanowire from the second electrical resistance to a third electrical resistance that is lower than the first electrical resistance;
the resetting voltage is less than the first setting voltage and greater than the first reading voltage; and
the applying the resetting voltage causes entry into a second memory state by effectuating a change of the electrical resistance of the first nanowire from the third electrical resistance to a fourth electrical resistance that is closer in value to the first electrical resistance than to the third electrical resistance.

14. The device of claim 13, wherein the third electrical resistance is substantially equal to the second electrical resistance, and wherein the fourth electrical resistance is substantially equal to the first electrical resistance.

15. The device of claim 13, wherein the operations further comprise:
applying a second reading voltage across the first electrode and the second electrode, wherein the second reading voltage is less than the first setting voltage, wherein the second reading voltage is sufficiently small such that the applying of the second reading voltage causes no more than an insignificant change of the electrical resistance of the first nanowire from the fourth electrical resistance, and wherein the insignificant change is a change of no greater than 10% from the fourth electrical resistance.

16. The device of claim 13, wherein the operations further comprise:
applying a second setting voltage across the first electrode and the second electrode, wherein the applying of the second setting voltage causes another migration of other ions from one or more of the first electrode and the second electrode to the surface of the first nanowire, and wherein the another migration of other ions effectuates another reduction of electrical resistance of the first nanowire from the fourth electrical resistance to a fifth electrical resistance that is lower than the fourth electrical resistance.

17. The device of claim 12, wherein:
the first electrode comprises one of Ag, Au, Cu, Pd, Pt, or any combination thereof; and
the second electrode comprises one of Ag, Au, Cu, Pd, Pt, or any combination thereof.

18. The device of claim 12, wherein:
the first nanowire comprises one or more of ZnO, $TiO_2$, carbon nanotube, $VO_2$, or any combination thereof; and
the second nanowire comprises one or more of ZnO, $TiO_2$, carbon nanotube, $VO_2$, or any combination thereof.

19. A non-transitory machine-readable storage medium comprising executable instructions that, when executed by a processing system including a processor, perform operations, the operations comprising:
applying a setting voltage across a pair of electrodes comprising a first electrode and a second electrode, a first nanowire having a first electrical resistance being electrically connected between the first electrode and the second electrode, a second nanowire being disposed adjacent to the first nanowire to form a gap between the first nanowire and the second nanowire, the second nanowire being disposed substantially parallel to the first nanowire, a migration of ions from one or more of the first electrode and the second electrode to a surface of the first nanowire being caused by the applying of the setting voltage, the second nanowire being configured to force at least some of the ions to settle in a potential well at a location along the first nanowire, the migration of ions causing a reduction of electrical resistance of the first nanowire from the first electrical resistance, and the reduction of the electrical resistance of the first nanowire causing entry into a first memory state of a device comprising the first nanowire and the second nanowire; and
applying a reading voltage across the first electrode and the second electrode, the reading voltage being less than the setting voltage, the reading voltage being sufficiently small such that the applying of the reading voltage causes a change of the electrical resistance of the first nanowire while still maintaining the first memory state.

20. The non-transitory machine-readable storage medium of claim 19, wherein the operations further comprise applying a resetting voltage across the first electrode and the second electrode, wherein:
   the reduction of the electrical resistance of the first nanowire from the first electrical resistance is to a second electrical resistance that is lower than the first electrical resistance;
   the applying of the reading voltage causes a change of the electrical resistance of the first nanowire from the second electrical resistance to a third electrical resistance that is lower than the first electrical resistance;
   the resetting voltage is less than the setting voltage and greater than the reading voltage; and
   the applying the resetting voltage causes entry into a second memory state by effectuating a change of the electrical resistance of the first nanowire from the third electrical resistance to a fourth electrical resistance that is closer in value to the first electrical resistance than to the third electrical resistance.

* * * * *